United States Patent [19]
Menzies et al.

[11] Patent Number: 5,982,635
[45] Date of Patent: Nov. 9, 1999

[54] SIGNAL ADAPTOR BOARD FOR A PIN GRID ARRAY

[75] Inventors: L. William Menzies, Redwood City; Stephen W. Menzies, El Dorado Hills; Dale S. Mackey, San Jose, all of Calif.

[73] Assignee: Concept Manufacturing, Incorporated, El Dorado Hills, Calif.

[21] Appl. No.: 08/735,832

[22] Filed: Oct. 23, 1996

[51] Int. Cl.⁶ .................................................... H05K 1/18
[52] U.S. Cl. ........................ 361/790; 361/767; 361/768; 361/735; 361/785; 361/683; 361/791; 361/700; 361/777; 439/70; 439/60; 439/68; 439/75; 257/692; 257/700; 257/713; 257/717
[58] Field of Search ................................... 361/790, 767, 361/768, 735, 785, 683, 791, 700, 777; 439/70, 60, 68, 75; 257/692, 700, 713, 717

[56] References Cited

U.S. PATENT DOCUMENTS

| | | | |
|---|---|---|---|
| Re. 31,929 | 6/1985 | Donaher et al. | 361/396 |
| 3,846,734 | 11/1974 | Pauza et al. | 439/70 |
| 3,875,478 | 4/1975 | Capstick | 361/403 |
| 4,356,532 | 10/1982 | Donaher et al. | 361/396 |
| 4,494,172 | 1/1985 | Leary et al. | 361/400 |
| 4,519,658 | 5/1985 | Biswas | 361/393 |
| 4,626,958 | 12/1986 | Lockhard et al. | 357/74 |
| 4,636,918 | 1/1987 | Jodoin | 361/405 |
| 4,779,164 | 10/1988 | Menzies, Jr. et al. | 361/393 |
| 4,882,656 | 11/1989 | Menzies, Jr. et al. | 361/393 |
| 4,912,401 | 3/1990 | Nady et al. | 324/158 |
| 5,061,989 | 10/1991 | Yen et al. | 257/692 |
| 5,168,432 | 12/1992 | Murphy et al. | 361/813 |
| 5,205,741 | 4/1993 | Steen et al. | 439/70 |
| 5,310,574 | 5/1994 | Holtmann | 427/58 |
| 5,445,526 | 8/1995 | Hoshino et al. | 439/69 |
| 5,460,531 | 10/1995 | Vivio | 439/70 |
| 5,481,435 | 1/1996 | Werther | 361/784 |
| 5,585,671 | 12/1996 | Nagesh et al. | 257/697 |

OTHER PUBLICATIONS

The Interconnection Specialists, Catalogue 201, IC Sockets (front page, preface, table of contents and pp. A–5, A–6, A–7, A–8, A–11, A–12, A–51 and A–52), EMC (Electronic Molding Corporation) Woonsocket, RI 02895.

Rogers "Micro–Q Decoupling Capacitors", Rogers Corporation, Tempe, Arizona, 1985.

"The Silencer IC Sockets with Decoupling Capacitors", Electronic Molding Corporation, Woonsocket, Rhode Island. Sep., 1986.

"Surface Mounted Decoupling Capacitor Sockets", Advanced Interconnections Warwick, Rhode Island.

Garry Product Bulletin, "Hi–Rel I.C. Sockets with Integral Decoupling Capacitors", Garry, Langhorne, PA. Jan., 1982.

Berg Electronics Brochure, McKenzie Socket Division, "Application Specific Modules Capabilities".

Primary Examiner—Leo P. Picard
Assistant Examiner—David Foster
Attorney, Agent, or Firm—Skjerven Morrill MacPherson Franklin & Friel LLP; Thomas S. MacDonald

[57] ABSTRACT

An interconnect structure adapts one or more signals conducted between a printed circuit board (PCB) and an integrated circuit (IC) including leads, the IC having signal requirements not provided by the PCB. The interconnect structure includes sockets that provideA. conductive paths between the circuit board and some, but not all, of the leads on the package. To adapt the signals, the interconnect structure also includes an intermediate adaptor board that includes one or more electrical components. The adaptor board and the sockets fit beneath the package containing the IC and above the PCB, and do not extend beyond the lateral boundaries of the package. Heat generated by these components during operation of the IC is dissipated through the IC package via a layer of thermally conductive material sandwiched between the component and the package. The intermediate adaptor board and the socket combine to perform all necessary signal conversion, including power supply voltage levels, between the circuit board and the IC.

11 Claims, 6 Drawing Sheets

SIGNAL ADAPTOR BOARD FOR A PIN GRID ARRAY

BACKGROUND

1. Field of the Invention

This invention relates generally to signal adaptor boards used for adapting signals between a printed circuit board and an integrated circuit having signal requirements not provided by the printed circuit board. More particularly, the invention relates to an adaptor board for converting a power supply voltage from a printed circuit board to a second power supply voltage required by an integrated circuit.

2. Discussion of the Related Art

Printed circuit boards (PCBs) include one or more rigid or flexible layers of a dielectric material having conductors fabricated upon or within the material. A PCB is designed to receive separately manufactured electrical components and to interconnect those components to create a more complex circuit.

There are many instances in which an electrical component on a PCB is replaced with a component having a different pin configuration or different signal requirements. For example, a computer user may upgrade a computer to include a more powerful microprocessor that requires a lower power-supply voltage than did the original microprocessor. Unfortunately, such changes often necessitate replacement of an otherwise good PCB.

Many manufacturers use an "adaptor card" to avoid the expense of replacing a PCB when upgrading a component. An adaptor card is designed to be placed between the PCB and the new component. Any required changes to the interconnect architecture are accomplished by the adaptor card instead of on the PCB, obviating the need to alter or replace the PCB. An adaptor card can be surface mounted to a larger PCB using wave solder techniques. Alternatively, an adaptor card can be "plugged" into sockets arranged upon the PCB, and the electrical component can be surface mounted or plugged into the adaptor card. The adaptor card is configured to compensate for any modifications to the component pin-out, modifications to signals sent to and from the component, or modifications to the operating characteristics of the component. Thus, using an adaptor card obviates the need to rework the larger PCB when upgrading a component.

FIGS. 1A and 1B illustrate a prior-art interconnect system 10 including an adaptor card 16 electrically and mechanically connected between an electrical component 14 and a PCB 12. A plurality of board sockets 18 are arranged within one surface of PCB 12 and are used to mechanically receive plugs 20 (also at times called "pins") aligned therewith. Mating plugs 20 and sockets 18 electrically connects printed conductors 22 within PCB 12 and printed conductors 24 within adaptor card 16. Any modifications to the interconnect layout between PCB 12 and component 14 can be effectuated entirely within printed conductors 24 instead of printed conductors 22. Moreover, changes in the signal timing or signal level within one or more interconnect paths can be made by component 26 retrofitted on card 16 instead of on PCB 12. Component 26 is any component that adapts or modifies signals sent across conductors 24 or conductors 22.

FIGS. 1A and 1B show a signal V routed in a printed wire 28 within PCB 12. Signal V is therefore shown as a signal transferred within conductors embedded in PCB 12 and is electrically connected to one or more PCB sockets 18. PCB socket 18 is adapted to receive pass-through plug 29 (FIG. 1B) to transfer signal V from PCB 12 to adapter card 16. Adapter card 16 can then convert signal V and present the converted signal back to a non-pass-through socket 30. Nonpass-through socket 30 allows connection of the converted signal V to a corresponding pin location 32 without transferring the converted signal back to a corresponding socket in PCB 12. The embodiment of FIGS. 1A and 1B provides interconnect routing of signal V to and from signal converter 26 and also provides pass-through of non-converted signals.

Pass-through and non pass-through of select signals are achieved using appropriately placed pass-through vias 34 and non pass-through vias 36. Each pass-through via and each non pass-through via extends entirely through adapter card 16 in a straight line perpendicular to the opposing surfaces of card 16. The non pass-through plug 36 prevents electrical conduction to an underlying socket contained within a PCB 12. Pass-through plug 52, however, does maintain electrical connection to underlying PCB 12 and can be used to receive and pass-through signals to a corresponding pin of adaptor card 16.

An unfortunate aspect of conventional adaptor card 16 is the lateral displacement of component 26. This displacement adds length to conductors 24 and necessitates the extension of adaptor board 16 well beyond the lateral boundaries of component 14. This lateral extension is problematic in many applications because the additional length of adaptor card 16 interferes with components or structures adjacent to component 14. Furthermore, the added conductor length required to displace component 26 increases the parasitic resistance, capacitance, and inductance of the elongated signal paths. These changes can adversely affect the speed performance of component 14.

SUMMARY

An interconnect structure adapts one or more signals conducted between a printed circuit board (PCB) and a package containing an integrated circuit (IC) that has signal requirements not provided by the PCB. The interconnect structure includes sockets that provide conductive paths between the circuit board and some, but not all, of the leads on the package. To adapt the signals, the interconnect structure also includes an intermediate adaptor board that includes one or more electrical components.

The adaptor board and the sockets fit beneath the package containing the IC and above the PCB, and do not extend far, if at all, beyond the lateral boundaries of the package. Heat generated by these components during operation of the IC is dissipated through the IC package via a layer of thermally conductive material sandwiched between the component and the package. The intermediate adaptor board and the socket combine to perform all necessary signal conversion, including power supply voltage levels, between the circuit board and the IC.

BRIEF DESCRIPTION OF THE FIGURES

These and other features, aspects, and advantages of the present invention will become better understood with regard to the following description, appended claims, and accompanying figures, where:

DETAILED DESCRIPTION

Figure 1A:
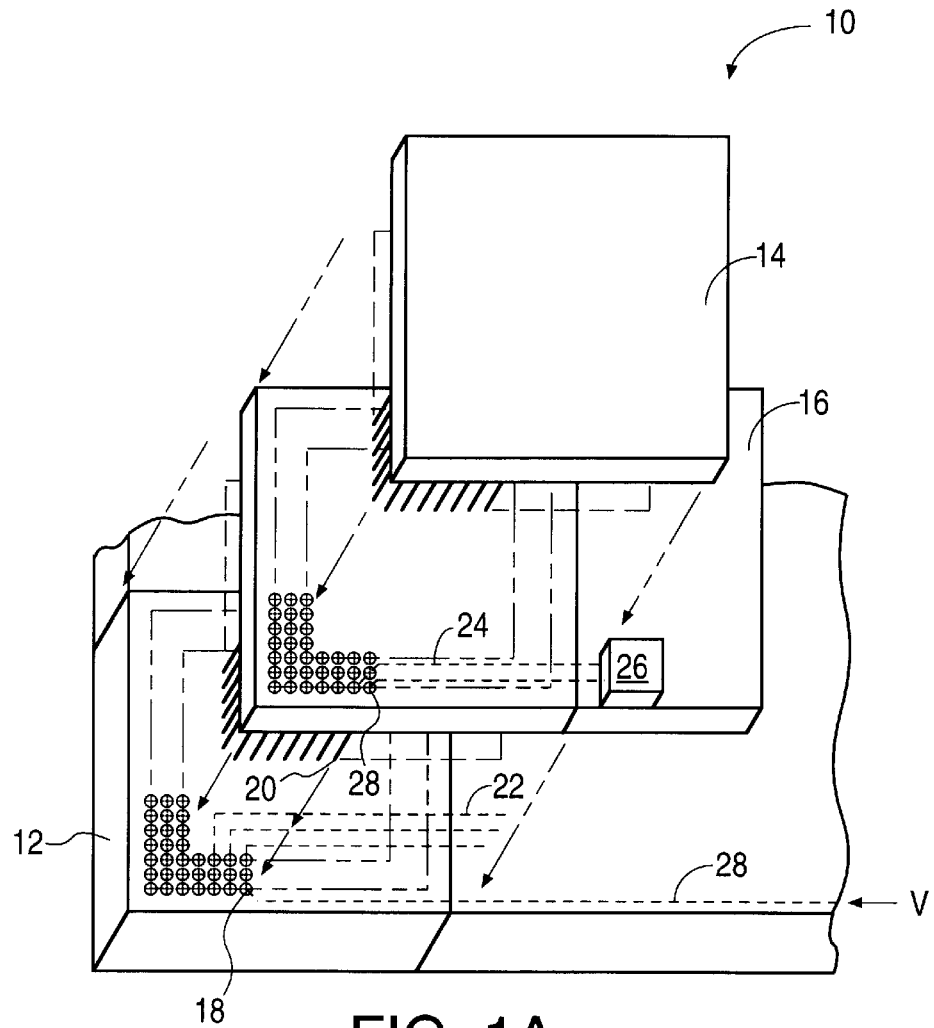
FIG. 1A is an exploded perspective view of a prior art interconnect system utilizing an adaptor card.
Figure 1B:
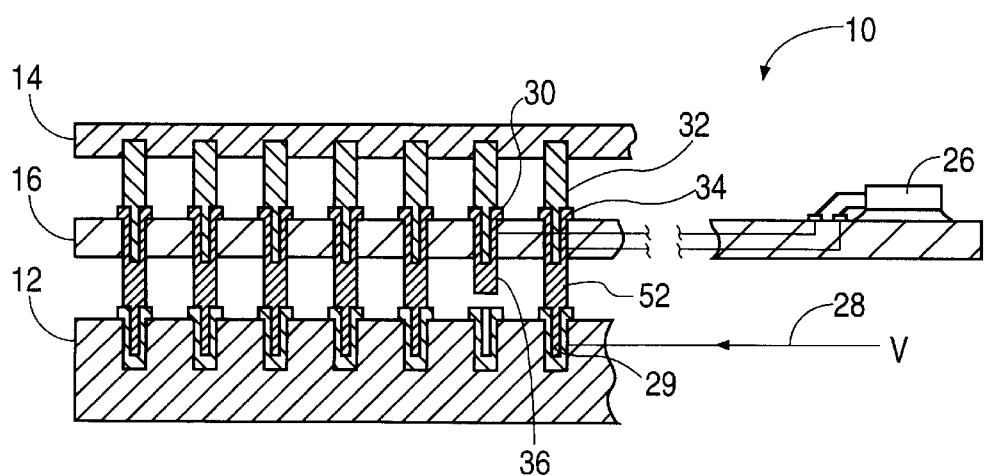
FIG. 1B is an assembled cross-sectional view of the prior art interconnect system of FIG. 1A.
Figure 2A:
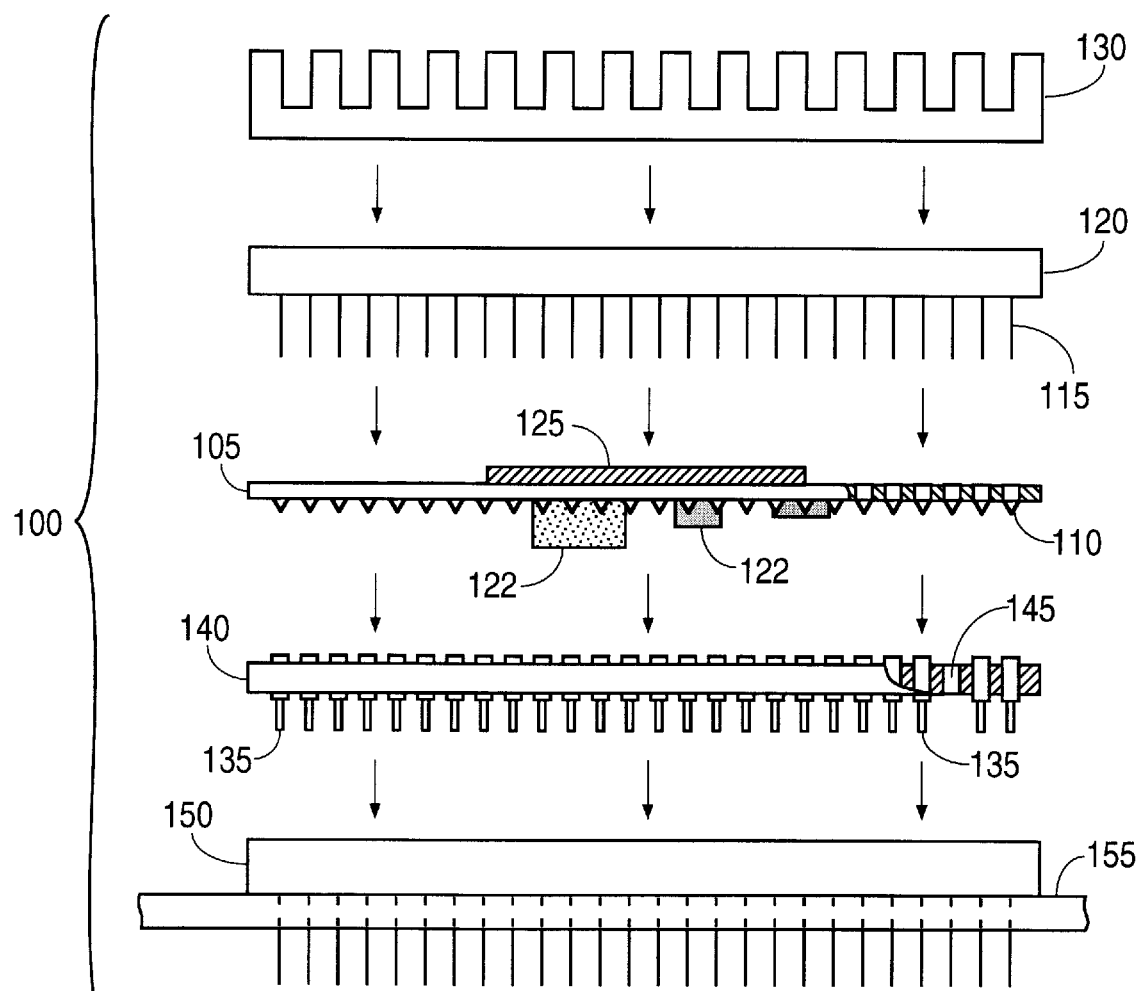
FIG. 2A is an exploded view, partially in section, illustrating an interconnect structure in accordance with the present invention.
Figure 2B:
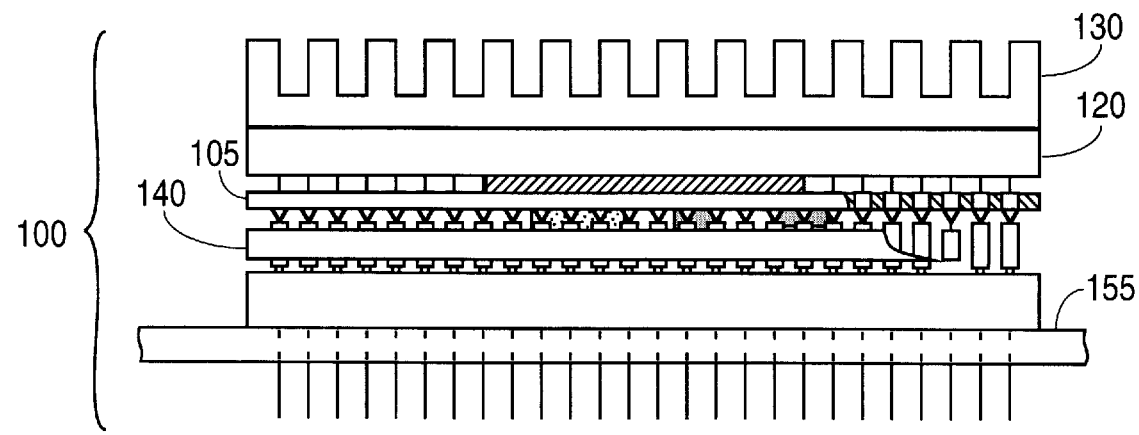
FIG. 2B is an assembled side view, partially in section, of the interconnect structure of FIG. 2A.

FIGS. 2A and 2B illustrate in exploded and assembled views an interconnect structure 100 in accordance with the present invention. Interconnect structure 100 includes an adaptor board 105 with a grid of electrical contacts 110 adapted to slide over leads (pins) 115 of a semiconductor package 120. Semiconductor package 120 typically includes at least one integrated circuit (IC). A layer 125 of thermally conductive material is sandwiched between the underside of semiconductor package 120 and adaptor board 105. Layer 125 provides improved thermal conduction between adaptor board 105 and package 120 when interconnect structure 100 is assembled with semiconductor package 120 as shown in FIG. 1B. Such thermal conduction is necessary because one or more components 122 on adaptor board 105 generate heat (thermal energy) that must be dissipated. In the embodiment of FIGS. 2A and 2B, this heat is dissipated by routing thermal energy through adaptor board 105 and layer 125 to semiconductor package 120.

In one embodiment layer 125 is a sheet of T-pli Series 200 thermally conductive elastomer, typically having a thickness of from 75 to 100 mils available from Thermagon, Inc., of Cleveland, Ohio. Different thermally conductive materials may also be used, or the layer 125 may be eliminated altogether if the adaptor board 105 or the components 122 are mounted against the package 120. In these embodiments, the thermally conductive layer between the components 122 and the package 120 may simply be the packaging material encasing components 122.

To aid in the dissipation of thermal energy, the top surface of semiconductor package 120 is attached to a heat sink 130. Heat sink 130 typically includes cooling fins, but may also include a thermoelectric cooler or a fan for improved performance. Thermal energy imparted to semiconductor package 120 from components 122 is conducted through semiconductor package 120 for release into the ambient environment.

Leads 115 are long enough to extend through adaptor board 105 and into pass-through vias 135 of a PGA socket 140. However, not all of leads 115 extend into pass-through vias 135: some of leads 115 have no corresponding pass-through via, but instead extend into vacancies 145 in PGA socket 140, and are not long enough to make electrical contact with the underlying socket 150 and motherboard 155.

Figure 3:
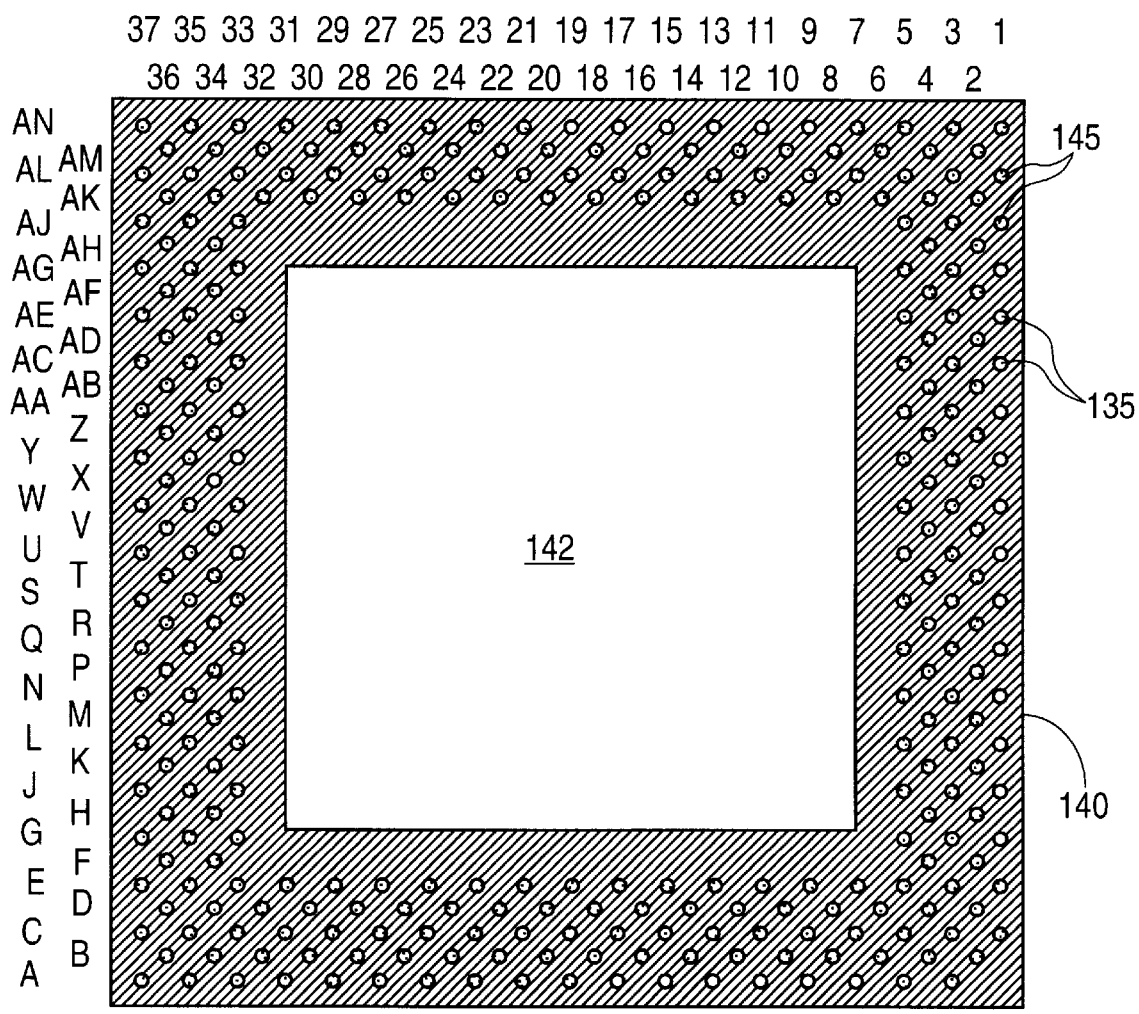
FIG. 3 is a plan view of PGA socket for an embodiment (the "P55C" embodiment) used to adapt an Intel P55C processor to a "Socket 7" motherboard designed to receive older versions of the Intel Pentium processor.

FIG. 3 is a plan view of PGA socket 140 for an embodiment (the "P55C" embodiment) used to adapt an Intel P55C processor to a "Socket 7" motherboard designed to receive older versions of the Intel Pentium processor. Pentium processors typically require a 3.3 volt power source; however, the newer P55C processor requires both 3.3 and 2.8 volt power sources. The P55C embodiment receives 3.3 volts from a Pentium motherboard and delivers the appropriate 3.3 or 2.8 volt signal to pins on a P55C processor, eliminating the expense of altering or replacing the motherboard. Socket 7 sockets, conventionally used to connect Pentium processors to motherboards, are available from Berg Electronics of Fremont, Calif.

PGA socket 140 is approximately 1.95 inches square and is cut out to include an aperture 142 approximately 1.20 inches square. In the P55C adaptor embodiment, PGA socket 140 of FIG. 3 is a screw machine style socket available from Concept Manufacturing, Inc., of Redwood City, Calif., as part number CM269IF19-C69-SULI-GG. As discussed above in connection with FIG. 2A, pass-through vias 135 provide contact between leads 115 and corresponding socket conductors of motherboard 155, while vacancies 145 prevent such contact. In the P55C embodiment, vacancies 145 prevent those of leads 115 that are supplied with 2.8-volts from contacting the 3.3 volt plane on motherboard 155. It is to be understood that motherboard 155 contains both power planes and ground planes as is known in the prior art. Each of vias 135 and vacancies 145 is specified on the periphery of FIG. 3 alphanumerically by row and column. For different applications, PGA socket 140 may include a different configuration of pass-through vias 135 and vacancies 145.

Figure 4:
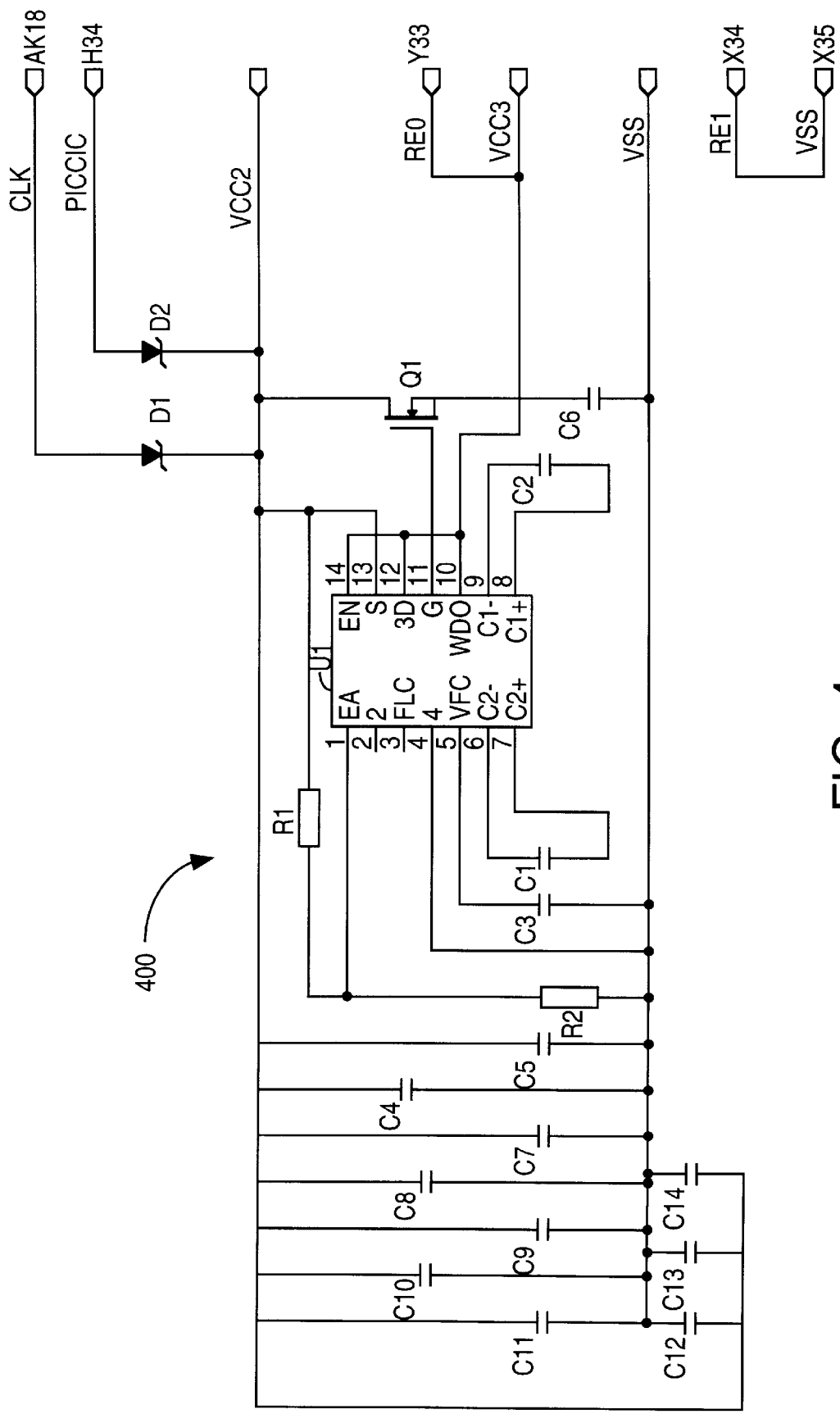
FIG. 4 is a schematic diagram of a circuit implemented as part of the P55C embodiment of an adaptor board.

FIG. 4 is a schematic diagram of a circuit 400 implemented as part of the P55C embodiment of adaptor board 105. Circuit 400 adapts a 3.3-volt motherboard to a P55C processor that, as discussed above, requires both 3.3 and 2.8 volt supply voltages. Capacitors C4, C5, and C7 through C14 are surface-mount decoupling capacitors connected between ground (VSS) and the 2.8-volt line VCC2. These capacitors advantageously decrease noise associated with the line VCC2; their close proximity to the 2.8-volt source (regulator U1) enhances their effectiveness. For more information about the decoupling capacitors, see U.S. Pat. Nos. 4,779,164 and 4,882,656.

Voltage regulator U1 controls the gate voltage (and therefore the source-drain resistance) of a power transistor Q1 to provide a regulated 0.5-volt drop from the 3.3-volt line VCC3 to the 2.8-volt line VCC2. Transistor Q1 generates a substantial amount of heat in maintaining that voltage drop. The alphanumeric designations listed for the various terminals of FIG. 4 refer to corresponding locations illustrated in FIGS. 3, 5A, and 5B. In one embodiment, voltage regulator U1 is a MIC 5158 Super Low-Dropout Regulator Controller available from Micrel, Inc., of San Jose, Calif., and transistor Q1 is a MTD220N03HDL power FET available from Motorola, Inc., of Phoenix, Ariz. Diodes D1 and D2 protect clock circuits from excessive voltages.

Figure 5A:
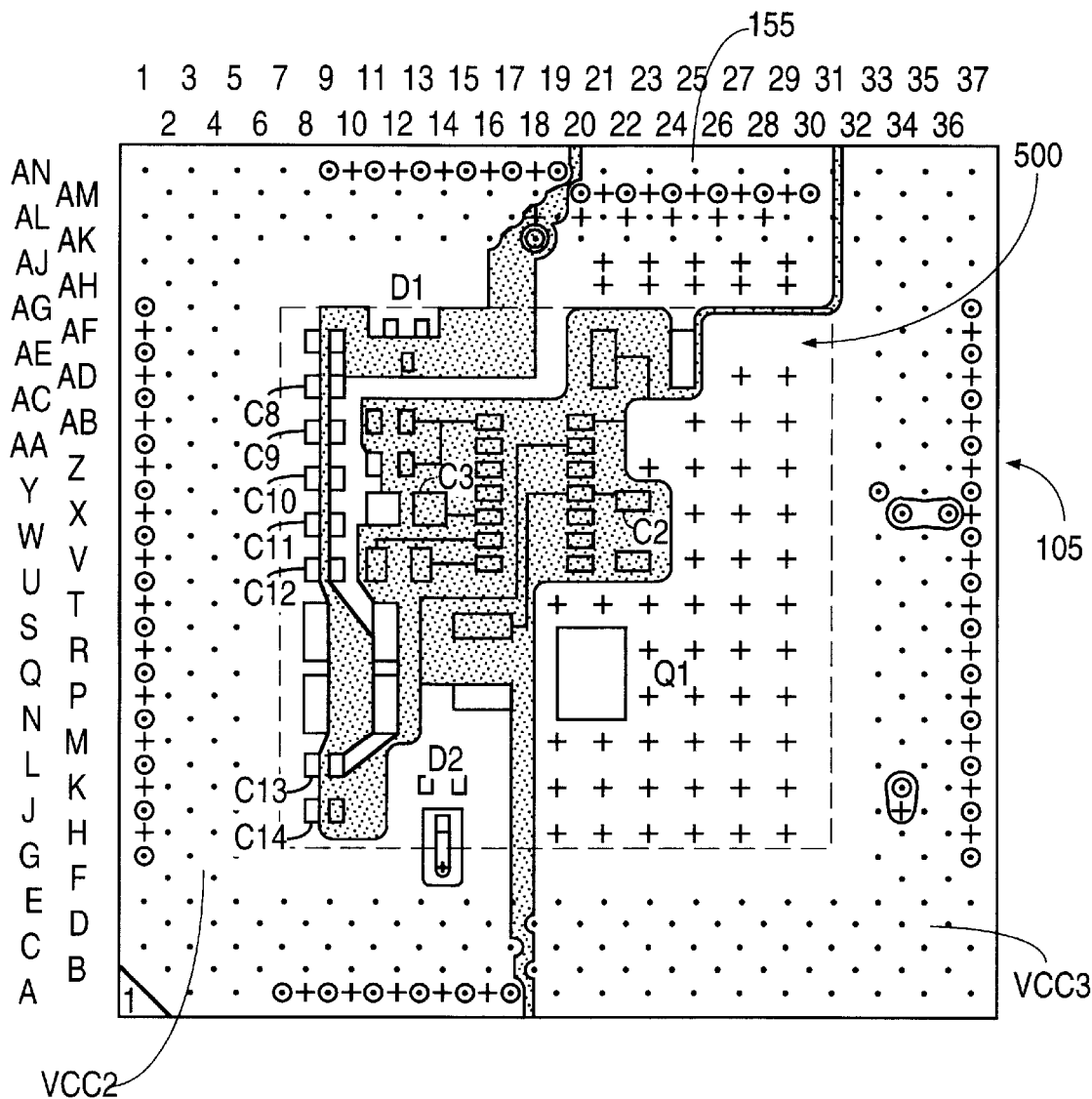
FIGS. 5A and 5B are respective component-side and package-side views of intermediate adaptor board, which provides interconnections between a P55C processor and a Socket 7 motherboard as specified in the schematic of FIG. 4.
Figure 5B:
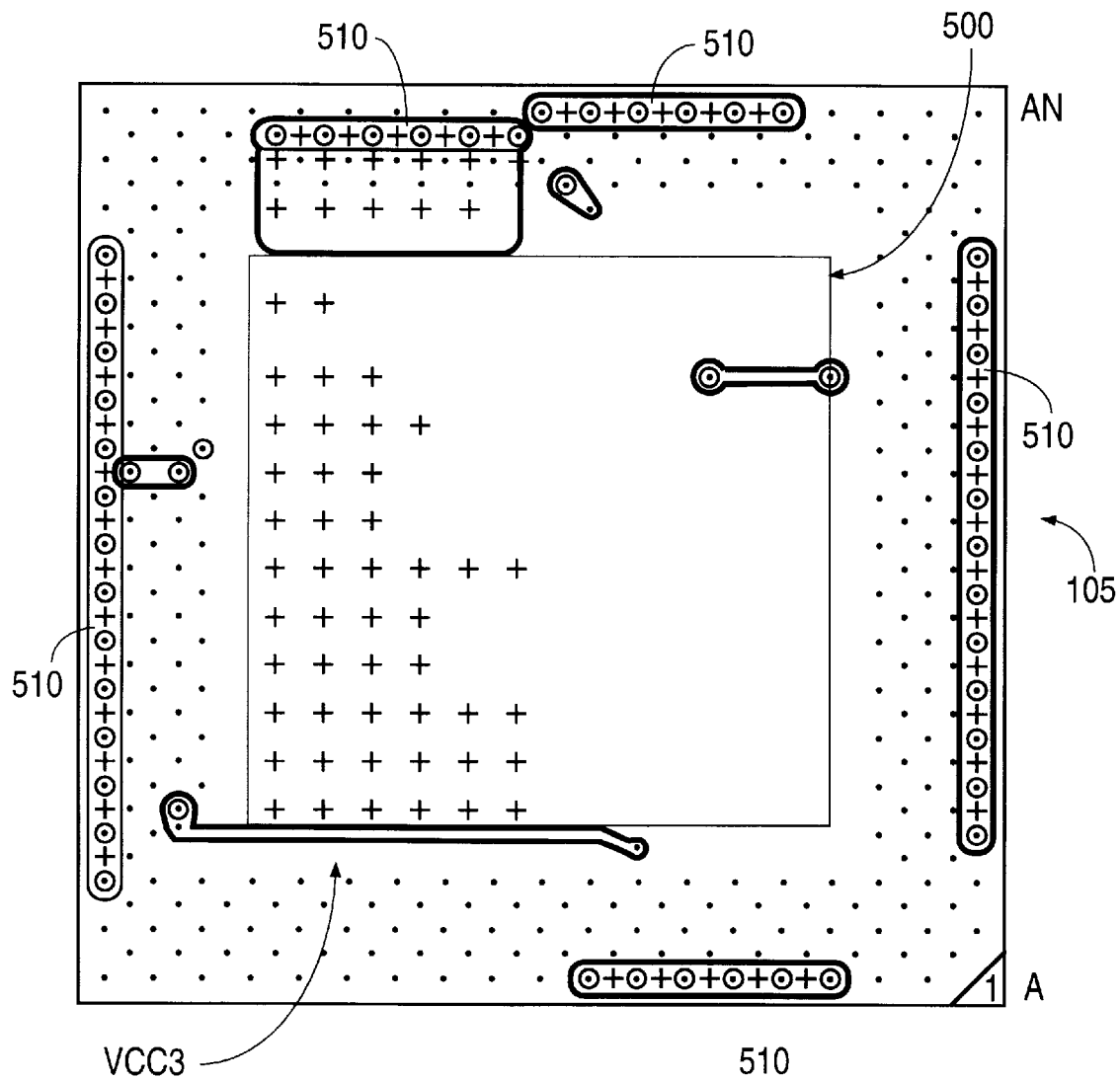

FIGS. 5A and 5B are respective component-side and package-side plan views of intermediate adaptor board 105, which provides interconnections between a P55C processor and a Socket 7 motherboard as specified in the schematic of FIG. 4. Adaptor board 105 includes pads, depicted as rectangles, for connecting the surface-mount components of FIG. 4. The component designations of FIG. 5A indicate the physical locations of the corresponding components of FIG. 4.

Referring first to FIG. 5A, adaptor board 105 includes a ground plane VSS, a 2.8-volt plane VCC2, a 3.3-volt plane VCC3, and a number of conductors for routing signals in accordance with the schematic of FIG. 4. Adaptor board 105 is normally constructed of thin (0.46 mm to 0.79 mm, and preferably 0.51 mm±0.05 mm) FR4 epoxy fiberglass, copper clad material and processed in the conventional manner of a circuit board with single or multiple layers. Plug-in electrical contacts 110 (FIG. 2A) typically include either four or six spring fingers of gold-plated beryllium copper. Contacts 110 may be Model #15 or Model #22 manufactured by Mill Max Mfg. Corp. of Oyster Bay, N.Y. A solder paste is utilized to connect the metallization of the circuit traces, normally copper, to the gold-plated plug-in contacts. The solder paste may be that used in the process offered by Mask Technology, Inc., of Santa Ana, Calif., know as the "Precision Pad Technology" process. U.S. Pat. Nos. 5,310,574, 5,395,040 and 5,403,671 describe the process and are incorporated herein by reference.

Adaptor board 105 includes a number of apertures, of which there are three basic types. The majority of the apertures, designated by "dots" in FIG. 5A, are through holes sufficiently wide to allow free passage of leads 115 of package 120. In another embodiment these apertures include electrical contacts 110 (FIG. 2A). In either case, the conductive layers of adaptor board 105 are spaced away from these apertures to prevent electrical contact between leads 115 and adaptor board 105. The apertures designated with plus (+) signs are used to connect opposite conductive layers on adaptor board 105. These vias provide electrical and thermal communication between opposite conductive layers. Finally, the apertures designated as concentric dot and circles are vias that include electrical contacts 110 and that are electrically connected to corresponding ones of the leads 115 and to the surrounding conductive layer of adaptor board 105.

A solder mask (not shown) utilized in the adaptor board fabrication is a 0.004 inch high (0.10 mm) thick dry film mask or equal and may be of the type DM/KM3 four mil, by Morton Co. of Tustin, Calif. On the component side of adaptor board 105 (FIG. 5A) the solder mask covers all but the apertures designated as concentric dot and circles and the component pads.

The package side of adaptor board 105, depicted in FIG. 5B, includes a heat-sink area 500 that is electrically connected by a number of vias to the VCC3 plane on the component-side of adaptor board 105. In addition to conducting electricity, the vias connected between the respective 3.3-volt planes conduct heat away from transistor Q1 to heat sink area 500. As described above in connection with FIG. 2A, heat-sink area 500 is thermally coupled to package 120 through a thermally conductive layer 125. This allows the heat generated by transistor Q1 to be dissipated by heat sink 130.

On the package side (FIG. 5B) of adaptor board 105 the solder mask covers all but the apertures designated as concentric dot and circles, a number of solder bars 510, and heat-sink area 500. Applying no solder mask over heat-sink area 500 aids in transferring heat to thermally conductive layer 125. Using a relatively thick copper layer (e.g., a two-ounce copper layer) further enhances the ability of heat-sink area 500 to transfer heat.

Keeping package 120 cool optimizes the speed performance and life span of the semiconductor device within (e.g., a P55C processor). Thus, it may be necessary or advantageous to increase the capacity of heat sink 130 to remove heat from package 120. This may be accomplished using a number of conventional means, including the addition of a thermoelectric cooler or a fan. Heat sinks that may be adapted to the P55C embodiment are available from Mastacs, Inc., of Santa Fe Springs, Calif.

Although the present invention has been described in considerable detail with reference to certain preferred versions thereof, other versions are possible. For example, while adaptor board 105 is constructed using FR4 epoxy fiberglass, other dielectrics may be used to improve the thermal conductivity of adaptor board 105. And, while the principal component of adaptor board 105 that required a heat sink was a transistor, other types of components may generate excess heat and may therefore require similar treatment. The present invention may also be adapted to ball-grid array by, for example, using a ball-grid array to PGA adaptor between a ball-grid array semiconductor package and the adaptor board. Therefore, the spirit and scope of the appended claims are not limited to the description of the preferred versions contained herein.

What is claimed is:

1. An interconnect structure for adapting a signal sent between a conductor on a circuit board and at least one of a plurality of leads connected to an integrated circuit package, the package having first and second package surfaces, the interconnect structure comprising:

an intermediate adaptor board including:

first and second intermediate sockets, the first intermediate socket configured to receive the at least one lead, the second intermediate socket connected to the conductor on the circuit board; and a voltage regulator connected between the first and second intermediate sockets; and a thermally conductive layer disposed between the first package surface and the electrical component such that thermal energy from the voltage regulator is conducted to the package.

2. The structure of claim 1, wherein the conductor is configured to supply 3.3 volts to the second intermediate electrical contact and the voltage regulator is configured to supply 2.8 volts to the first intermediate electrical contact.

3. An interconnect structure for adapting a signal sent between a conductor on a circuit board and at least one of a plurality of leads connected to an integrated circuit package, the package having first and second package surfaces, the interconnect structure comprising:

an intermediate adaptor board including:

first and second intermediate sockets, the first intermediate socket configured to receive the at least one lead, the second intermediate socket connected to the conductor on the circuit board; and an electrical component connected between the first and second intermediate sockets;

a thermally conductive layer disposed between the first package surface and the electrical component such that thermal energy from the electrical component is conducted to the package; and further comprising a socket board for preventing electrical contact between the first intermediate electrical contact and the conductor and for providing electrical contact between the second intermediate electrical contact and the conductor.

4. An interconnect structure for adapting a signal sent between a conductor on a circuit board and at least one of a plurality of leads connected to an integrated circuit package, the package having first and second package surfaces, the interconnect structure comprising:

an intermediate adaptor board including:

first and second intermediate sockets, the first intermediate socket configured to receive the at least one lead, the second intermediate socket connected to the conductor on the circuit board; and an electrical component connected between the first and second intermediate sockets;

a thermally conductive layer disposed between the first package surface and the electrical component such that thermal energy from the electrical component is conducted to the package; and wherein the integrated circuit package encompasses an Intel™ P55C microprocessor.

5. An interconnect structure for adapting a signal sent between a conductor on a circuit board and at least one of a plurality of leads connected to an integrated circuit package, the package having first and second package surfaces, the interconnect structure comprising:

an intermediate adaptor board including:
first and second intermediate sockets, the first intermediate socket configured to receive the at least one lead, the second intermediate socket connected to the conductor on the circuit board; and an electrical component connected between the first and second intermediate sockets;

a thermally conductive layer disposed between the first package surface and the electrical component such that thermal energy from the electrical component is conducted to the package; and wherein the intermediate adaptor board further includes a ground plane and at least one decoupling capacitor connected between the ground plane and the first intermediate electrical contact.

6. A system for a converting a first power-supply voltage from a conductor on a printed circuit board to a second power-supply voltage required by an input lead of an integrated circuit package having first and second package surfaces and a plurality of conductive leads extending from the package, the system comprising:

an intermediate adaptor board including:
first and second intermediate sockets, the first intermediate socket configured to receive the at least one lead, the second intermediate socket connected to the conductor on the circuit board; and a voltage regulator connected between the first and second intermediate sockets;

a thermally conductive layer sandwiched between the first package surface and the voltage regulator such that thermal energy from the voltage regulator is conducted to the package; and a heat sink in contact with the second package surface.

7. An interconnect structure for adapting a signal sent between a conductor on a circuit board and at least one of a plurality of leads connected to an integrated circuit package, the package having first and second package surfaces, the interconnect structure comprising:

an intermediate adaptor board including:
first and second intermediate sockets, the first intermediate socket configured to receive the at least one lead, the second intermediate socket connected to the conductor on the circuit board; and a voltage regulator connected between the first and second intermediate sockets; and a thermally conductive layer sandwiched between the voltage regulator and the first package surface.

8. An interconnect structure for adapting a signal sent between a conductor on a circuit board and at least one of a plurality of leads connected to an integrated circuit package, the package having first and second package surfaces, the interconnect structure comprising:

an intermediate adaptor board including:
first and second intermediate sockets, the first intermediate socket configured to receive the at least one lead, the second intermediate socket connected to the conductor on the circuit board; and an electrical component connected between the first and second intermediate sockets;

a thermally conductive layer sandwiched between the component and the first package surface; and wherein the thermally conductive layer physically contacts the component surface and the first package surface.

9. An interconnect structure for adapting a signal sent between a conductor on a circuit board and at least one of a plurality of leads connected to an integrated circuit package, the package having first and second package surfaces, the interconnect structure comprising:

an intermediate adaptor board including:
first and second intermediate sockets, the first intermediate socket configured to receive the at least one lead, the second intermediate socket connected to the conductor on the circuit board; and an electrical component connected between the first and second intermediate sockets;

a thermally conductive layer sandwiched between the component and the first package surface; and further comprising a socket board for preventing electrical contact between the first intermediate electrical contact and the conductor and for providing electrical contact between the second intermediate electrical contact and the conductor.

10. An interconnect structure for adapting a signal sent between a conductor on a circuit board and at least one of a plurality of leads connected to an integrated circuit package, the package having first and second package surfaces, the interconnect structure comprising:

an intermediate adaptor board including:
first and second intermediate sockets, the first intermediate socket configured to receive the at least one lead, the second intermediate socket connected to the conductor on the circuit board; and an electrical component connected between the first and second intermediate sockets;

a thermally conductive layer sandwiched between the component and the first package surface; and wherein the intermediate adaptor board further includes a ground plane and at least one decoupling capacitor connected between the ground plane and the first intermediate electrical contact.

11. The structure of claim 1 wherein the integrated circuit package encompasses a microprocessor.

* * * * *